(12) United States Patent
Liang (10) Patent No.: US 8,971,051 B2
(45) Date of Patent: Mar. 3, 2015

(54) PORTABLE ELECTRONIC DEVICE WITH CHIP CARD EJECTING MECHANISM

(71) Applicants: Shenzhen Futaihong Precision Industry Co., Ltd., Shenzhen (CN); FIH (Hong Kong) Limited, Kowloon (HK)

(72) Inventor: Hua-Xiang Liang, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 43 days.

(21) Appl. No.: 13/864,640

(22) Filed: Apr. 17, 2013

(65) Prior Publication Data
US 2013/0286608 A1 Oct. 31, 2013

(30) Foreign Application Priority Data
Apr. 26, 2012 (CN) .......................... 2012 1 0125680

(51) Int. Cl.
  H01R 13/62 (2006.01)
  G06K 13/08 (2006.01)
  H05K 7/14 (2006.01)
  H01R 13/629 (2006.01)

(52) U.S. Cl.
  CPC ............ *H05K 7/1402* (2013.01); *H04B 1/3816* (2013.01); *H01R 13/629* (2013.01)
  USPC ........... 361/754; 361/736; 361/737; 361/756; 361/757; 361/759; 439/76.2; 439/155; 439/156; 439/157; 439/159

(58) Field of Classification Search
  CPC ... H05K 7/1402; H01R 13/629; H04B 1/3816
  USPC ................. 361/736–737, 756–759; 439/76.2, 439/155–157
  See application file for complete search history.

(56) References Cited

U.S. PATENT DOCUMENTS

| 7,008,245 | B1 * | 3/2006 | Chien .......................... 439/159 |
| 7,462,048 | B2 * | 12/2008 | Chuang et al. ................ 439/159 |
| 2006/0014407 | A1 * | 1/2006 | Wahler .......................... 439/159 |

(Continued)

FOREIGN PATENT DOCUMENTS

| TW | M271284 U | 7/2005 |
| TW | I271008 B | 1/2007 |

*Primary Examiner* — Dameon E Levi
*Assistant Examiner* — Rockshana Chowdhury
(74) *Attorney, Agent, or Firm* — Novak Druce Connolly Bove + Quigg LLP (57) ABSTRACT

A chip card ejecting mechanism includes a base body, a push member, a rotating member and an elastic member resisting between the base body and the rotating member. The base body includes a guiding member defining a hole and having a number of guiding rails. Each guiding rail includes a resisting surface and a guiding surface. The push member includes a push rod extending through the hole and a number of active gears. Each active gear defines an active cooperative surface. The rotating member includes a number of the passive gears. Each passive gear includes a passive cooperative surface. When the push member is pressed toward the rotating member by a transient external force, the rotating member compresses the elastic member until the active cooperative surface arrives at the guiding surface, the elastic member releases and drives the passive cooperative gears to slide along the first sliding slot.

14 Claims, 6 Drawing Sheets

(56) References Cited

U.S. PATENT DOCUMENTS

2010/0014260 A1* 1/2010 Qin et al. .................. 361/748
2012/0024958 A1* 2/2012 Wang et al. .................. 235/477
2012/0087068 A1* 4/2012 Ding .................. 361/679.01

* cited by examiner

PORTABLE ELECTRONIC DEVICE WITH CHIP CARD EJECTING MECHANISM

BACKGROUND

1. Technical Field

The present disclosure relates to portable electronic devices and particularly to portable electronic devices with chip card ejecting mechanisms.

2. Description of Related Art

Commonly, portable electronic devices such as mobile phones include a chip card holder for holding the chip card therein.

Typically, chip card holders define a receiving groove for receiving the chip card. The chip card is partly received in the receiving groove to electronically connect to a circuit of the device employing the chip card, and partly exposed so that it may be gripped for removal. However, the exposed part of the chip card is usually small and therefore difficult for a user to grasp when removing the chip card from the holder.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the exemplary chip card ejecting mechanism and portable electronic device using the chip card ejecting mechanisms. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
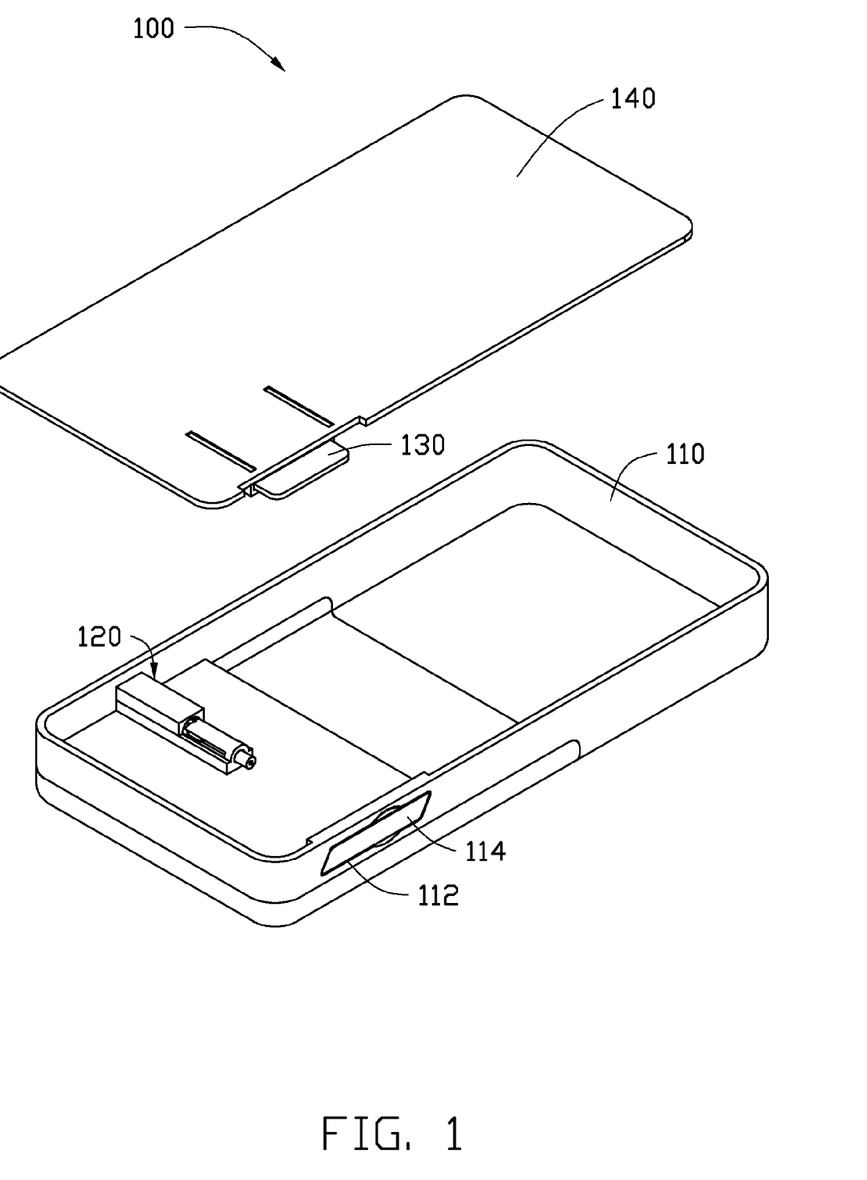
FIG. 1 is an exploded view of one embodiment of a chip card ejecting mechanism used in a portable electronic device.

FIG. 1 shows an embodiment of a chip card ejecting mechanism 120 that can be used in a portable electronic device 100, such as a cellular phone or any electronic device where a chip card is desirable. The portable electronic device 100 includes a housing 110, a circuit board 140, a chip card 130 slidably assembled to the circuit board 140 and received in the housing 110, and a chip card ejecting mechanism 120 configured to eject the chip card 130 to expose from the housing 110.

The housing 110 defines an opening 112 configured to plug the chip card 130 into the housing 110. A cover 114 is assembled to the housing 110 to protect the opening 112.

Figure 2:
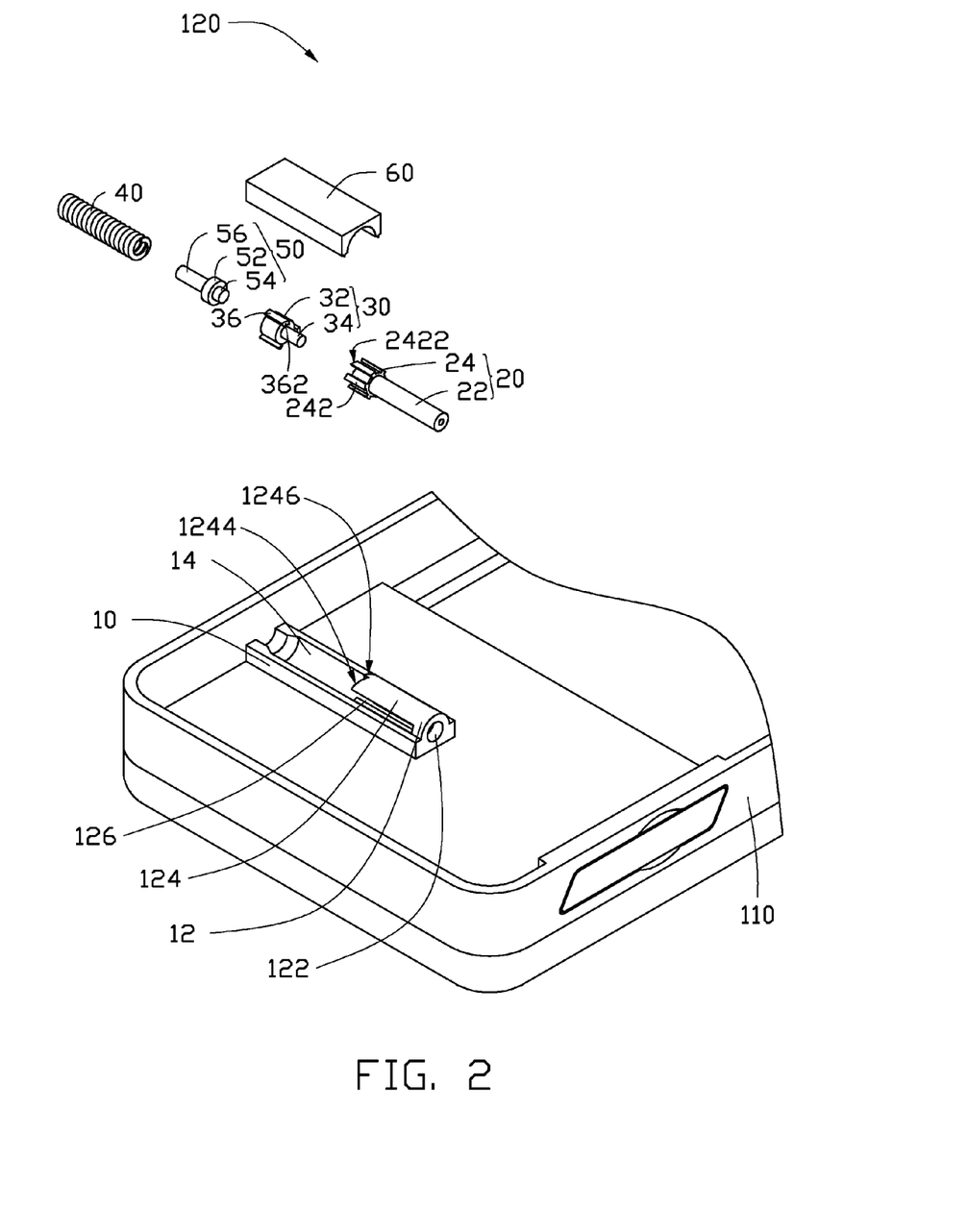
FIG. 2 is an exploded view of the chip card ejecting mechanism of FIG. 1.

Referring to FIG. 2, the chip card ejecting mechanism 120 includes a base body 10, a push member 20, a rotating member 30, an elastic member 40, a connecting member 50, and a cover body 60.

The base body 10 is substantially a hollow cylinder including a guiding member 12 and a receiving slot 14. The guiding member 12 defines a hole 122 communicating with the receiving slot 14. The push member 20, the rotating member 30, the connecting member 50 and the elastic member 40 are orderly received in the receiving slot 14 with the push member 20 partially exposed from the hole 122.

Figure 3:
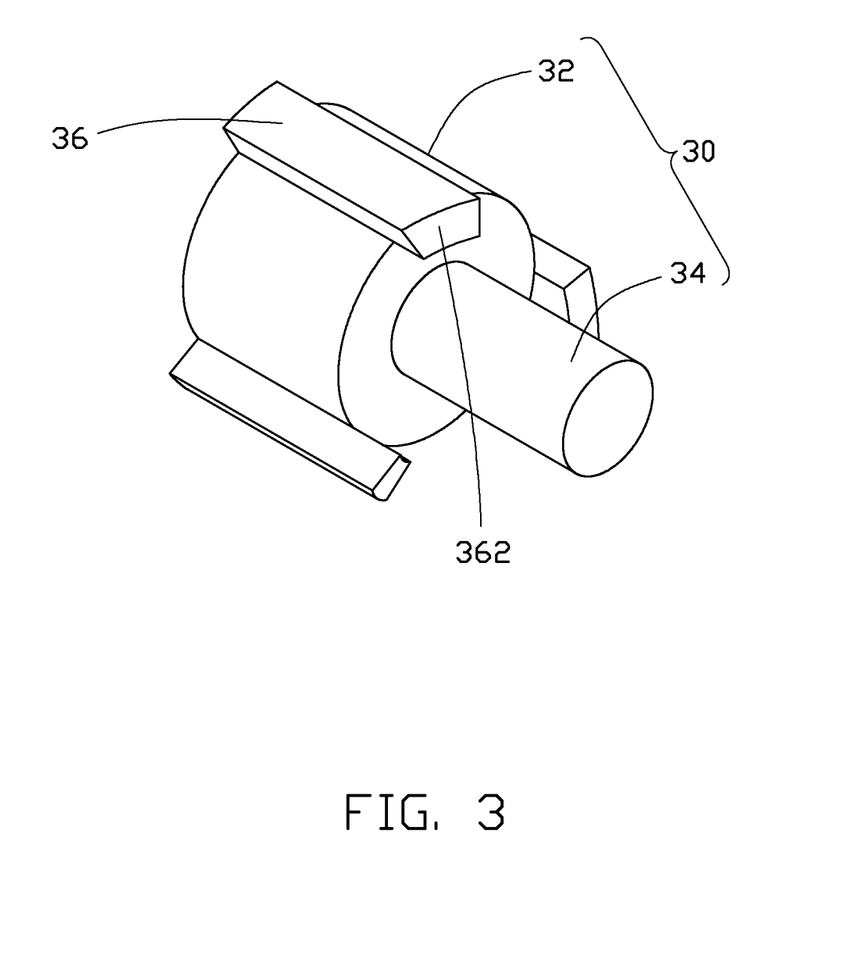
FIG. 3 is an enlarged view of a rotating member of a chip card ejecting mechanism of FIG. 1.
Figure 4:
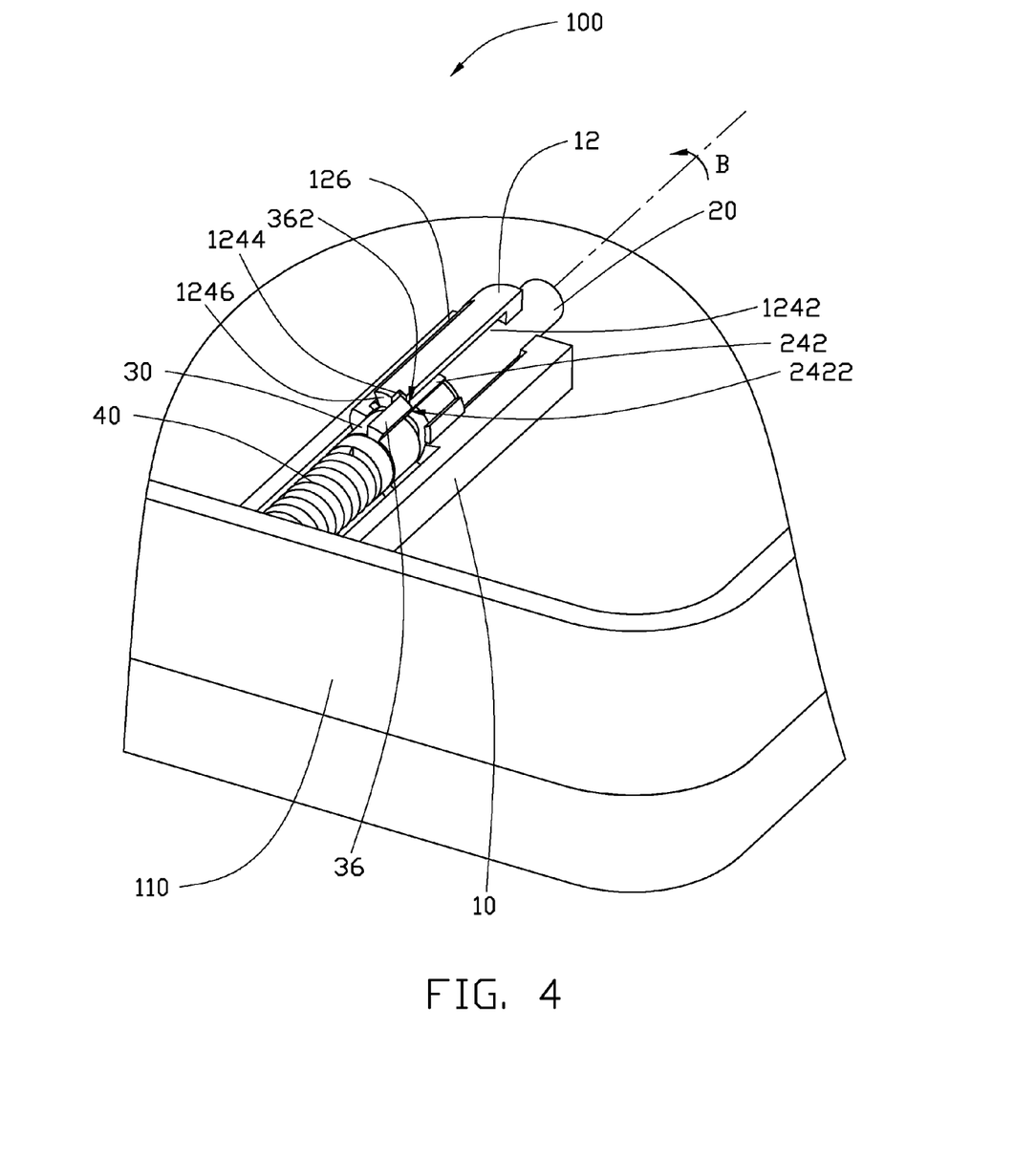
FIG. 4 is a partially cross-sectional view of the chip card ejecting mechanism of FIG. 1.
Figure 5:
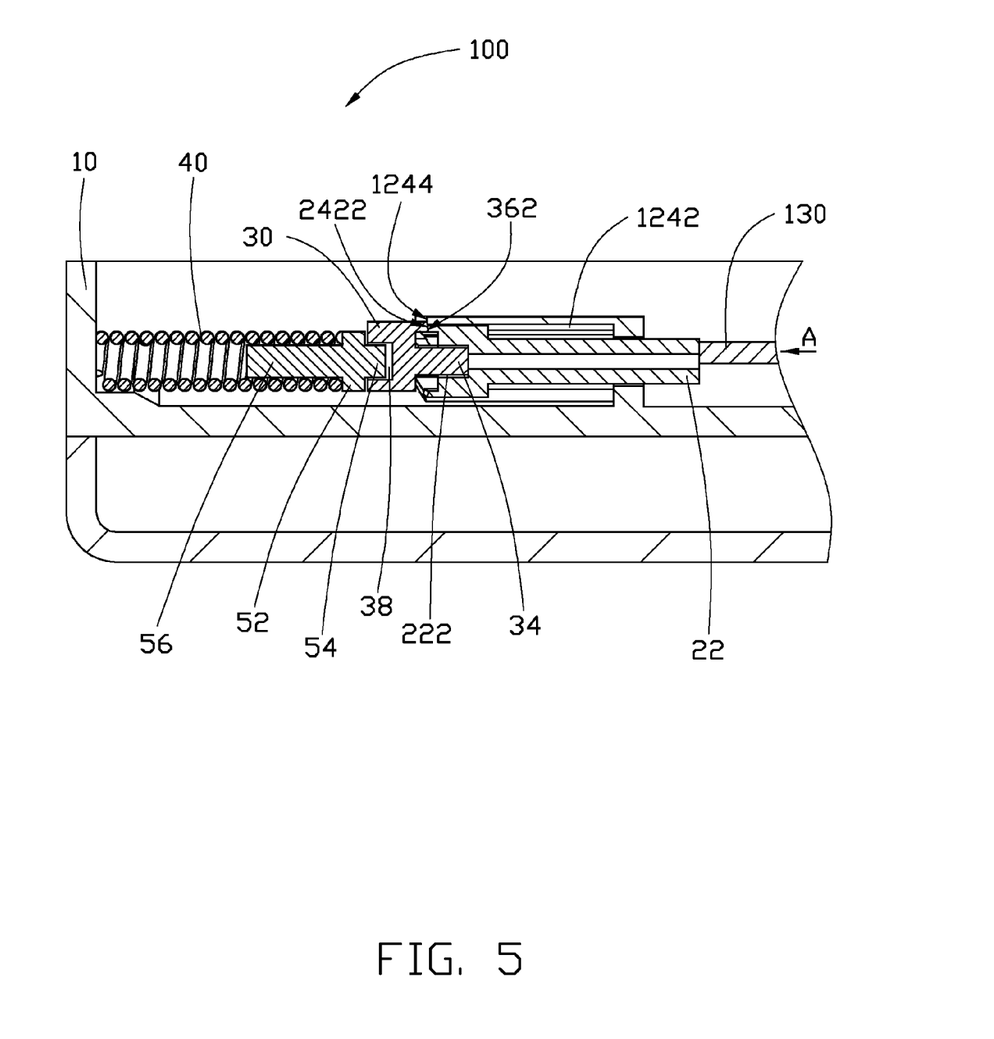
FIG. 5 is a cross-sectional view of the chip card ejecting mechanism of FIG. 1.

Also referring to FIGS. 4 and 5, the base body 10 includes a plurality of evenly spaced guiding rails 124 (see FIG. 2) axially protruding from a sidewall of the base body 10. Adjacent guiding rails 124 define a first sliding slot 126. Each guiding rails 124 defines a second sliding slot 1242 along an axial direction of the inside of the hole 122. The second sliding slots 1242 are evenly spaced with each other and parallel to the first sliding slots 126. Each guiding rail 124 defines a resisting surface 1244 (see FIG. 3) inclined from the adjacent first sliding slot 126 to the second sliding slot 1242 and a guiding surface 1246 (see FIG. 4) inclined from the second sliding slot 1242 to another adjacent first sliding slot 126. The resisting surface 1244 and the guiding surface 1246 have a same inclined direction.

The push member 20 includes a push rod 22 and a gear portion 24 positioned at an end of the push rod 22. The gear portion 24 includes a plurality of active gears 242 protruding from an outer peripheral surface of the gear portion 24. Each active gear 242 can be slidably received in one of the second sliding slots 1242. Each active gear 242 includes an active cooperative surface 2422 which has the same inclined direction as the resisting surface 1244. The push member 20 defines a first rotating hole 222.

Referring to FIG. 3, the rotating member 30 includes a main rotating body 32, a first rotating shaft 34 positioned at an end of the main rotating body 32 and a plurality of passive gears 36 protruding from an outer peripheral surface of the main rotating body 32. The first rotating shaft 34 can be rotatably received the first rotating hole 222 so that the rotating member can rotate relative to the push member 20. Each passive gear 36 includes a passive cooperative surface 362 configured to engage with the active cooperative surface 2422. Each passive gear 36 resists against one of the resisting surfaces 1244 and corresponds to one of the active cooperative surface 2422 received in the second sliding slot 1242. The main rotating body 32 defines a second rotating hole 38.

The connecting member 50 includes a resisting pad 52, a second rotating shaft 54 protruding from a first surface of the resisting pad 52 and a securing shaft 56 protruding from a second surface of the resisting pad 52 opposite to the second rotating shaft 54. The second rotating shaft 54 can be rotatably received the second rotating hole 38 so that the connecting member 38 can rotate relative to the push member 20. The elastic member 40 is sleeved around the securing shaft 56.

Referring to FIGS. 2-5, to assemble the portable electronic device 100, the push member 20 is received in the receiving slot 14 with the push rod 22 extending through the hole 122 and the active gears 242 slidably received in the second sliding slots 1242. The rotating member 30, the connecting member 50, and the elastic member 40 are orderly received in the receiving slot 14. The rotating member 30 engages with the push member 20 with the first rotating shaft 34 received in the first rotating hole 222 and the passive cooperative surface 362 resisting against the corresponding active cooperative surface 2422 and the resisting surface 1244. The second rotating shaft 54 is received in the second rotating hole 38. The elastic member 40 is sleeved around the securing 56 and received in the receiving slot 14. The cover body 60 is latched to the base body 10. The circuit board 140 is assembled into the housing 110 with the chip card 130 aligning with the push rod 22.

Figure 6:
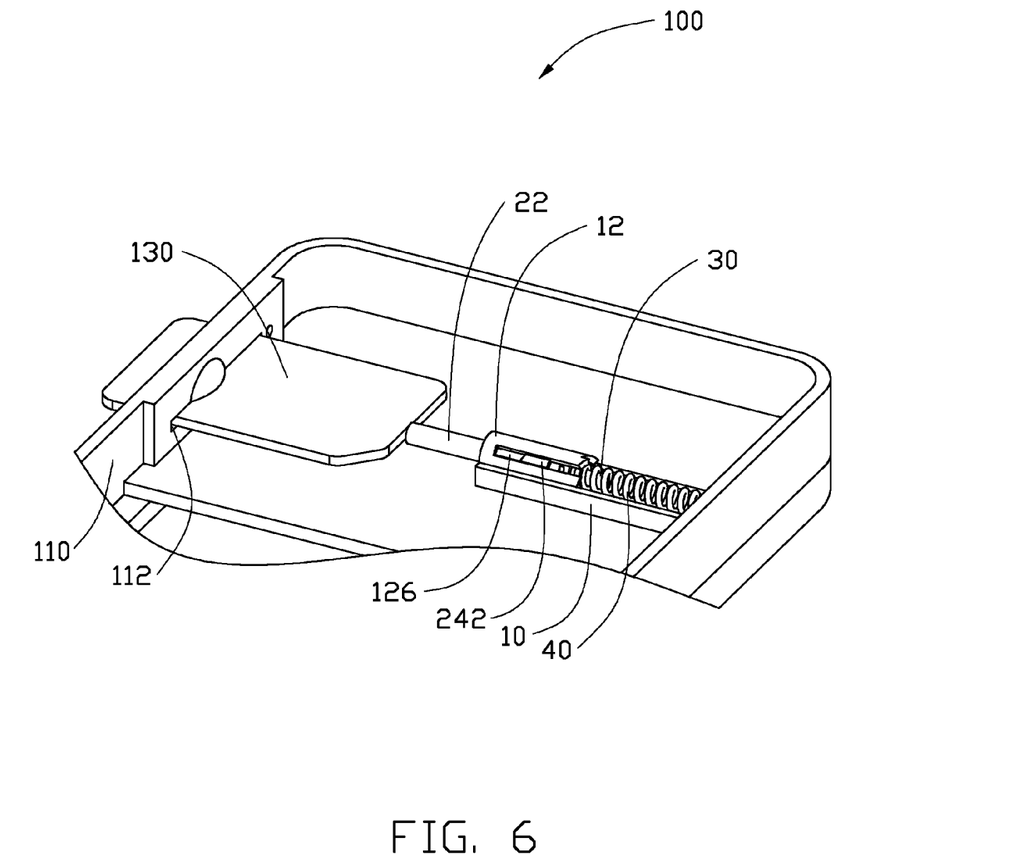
FIG. 6 is a partially, assembled view of the portable electronic device of FIG. 1.

Referring to FIG. 6, when detaching the chip card 130 out of the housing 110, the cover 114 is removed from the housing 110 to expose and end of the chip card 130 from the housing 110. The end of the chip card 130 is pressed inward, toward housing 110 by an external force along a direction A (FIG. 5). The chip card 130 pushes the push rod 22 to move toward the rotating member 30. The push rod 22 drives the passive gears 36 to slide in the second sliding slots 1242 and pushes the rotating member 30 to press the elastic member 40 so that the elastic member 40 is compressed to accumulate an elastic force. During the process that the passive gears 36 pushes the rotating member 30, the active cooperative surface 2422 engages with the passive cooperative surface 362. When the passive cooperative surface 362 and the active cooperative surface 2442 arrives at the guiding surface 1246, because the active cooperative surface 2422, the passive cooperative surface 362 and the guiding surface 1246 have the same inclined direction, the passive gears 36 move along the active cooperative surface 2422 and the guiding surface 1246 (i.e. rotates relative to the base body 10 along a direction B as shown in FIG. 4) and slide into the first sliding slots 126 by the elastic force of the elastic member 40. After the external force pressed on the chip card 130 is removed, the elastic member 40 releases and drives the passive gears 36 to slide along the first siding slots 126 so that the rotating member 30 pushes the push member 20 to eject a portion of the chip card 130 to be more exposed from the housing 110. Therefore, the chip card 130 can be easily removed from the housing 110.

In one embodiment, the connecting member 50 can be omitted, the elastic member 40 resists between the rotating member 30 and the housing 110.

It is to be understood, however, that even though numerous characteristics and advantages of the exemplary disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A chip card ejecting mechanism comprising:
a base body, the base body comprising a guiding member defining a hole, the guiding member comprising a plurality of guiding rails, adjacent guiding rails forming a first sliding slot, each guiding rail further comprising a resisting surface and a guiding surface having a same inclined direction;
a push member, the push member comprising a push rod extending through the hole and a plurality of active gears slidably received in the guiding member, each active gear defining an active cooperative surface;
a rotating member comprising a plurality of the passive gears, each passive gears comprising a passive cooperative surface resisting against one of the active cooperative surface;
an elastic member, the elastic member resisting between the base body and the rotating member;
wherein when the push member is pressed toward the rotating member by an external force, the rotating member compresses the elastic member until the active cooperative surfaces arrive at the guiding surface, the passive gears slide into the first sliding slots along the active cooperative surfaces and the guiding surfaces, after the external force is removed, the elastic member releases and drives the passive gears to slide along the first sliding slot so that the rotating member push the push rod to expose from the hole.

2. The chip card ejecting mechanism of claim 1, wherein the push member comprises a gear portion positioned at an end of the push rod, the active gears protrudes from an outer peripheral surface of the gear portion.

3. The chip card ejecting mechanism of claim 2, wherein the rotating member comprises a main rotating body, the passive gears protrude from an outer peripheral surface of the main rotating body.

4. The chip card ejecting mechanism of claim 3, wherein the gear portion defines a first rotating hole, the rotating member further comprises a first rotating shaft protruding from an end of the main rotating body, the first rotating shaft is slidably received in the first rotating hole.

5. The chip card ejecting mechanism of claim 4, further comprising a connecting member, the connecting member comprises a resisting pad and a second rotating shaft protruding from a first surface of the resisting pad, the rotating member defines a second rotating hole, the second rotating shaft is slidably received in the second rotating hole.

6. The chip card ejecting mechanism of claim 5, wherein the connecting member further comprises a securing shaft protruding from a second surface of the resisting pad opposite to the second rotating member, the elastic member is sleeved around the securing shaft.

7. The chip card ejecting mechanism of claim 1, wherein each guiding rail defines a second sliding slot along an axial direction of the hole parallel to the first sliding slots, each active gear is slidably received in one of the second sliding slots.

8. A portable electronic device comprising:
a housing;
a chip card received in the housing; and
a chip card ejecting mechanism assembled to the housing, the chip card ejecting mechanism comprising:
a base body, the base body comprising a guiding member defining a hole, the guiding member comprising a plurality of guiding rails, adjacent guiding rails forming a first sliding slot, each guiding rail further comprising a resisting surface and a guiding surface having a same inclined direction;
a push member, the push member comprising a push rod extending through the hole and a plurality of active gears slidably received in the guiding member, each active gear defining an active cooperative surface;
a rotating member comprising a plurality of the passive gears, each passive gears comprising a passive cooperative surface resisting against one of the active cooperative surface;
an elastic member, the elastic member resisting between the base body and the rotating member;
wherein when the push member is pressed toward the rotating member by a transient external force, the rotating member compresses the elastic member until the active cooperative surfaces arrive at the guiding surface, the passive gears slide into the first sliding slots along the active cooperative surfaces and the guiding surfaces, after the external force is removed, the elastic member releases and drives the passive gears to slide along the first sliding slot so that the rotating member push the push rod to eject the chip card to expose from the housing.

9. The portable electronic device of claim 8, wherein the push member comprises a gear portion positioned at an end of the push rod, the active gears protrudes from an outer peripheral surface of the gear portion.

10. The portable electronic device of claim 9, wherein the rotating member comprises a main rotating body, the passive gears protrude from an outer peripheral surface of the main rotating body.

11. The portable electronic device of claim 10, wherein the gear portion defines a first rotating hole, the rotating member further comprises a first rotating shaft protruding from an end of the main rotating body; the first rotating shaft is slidably received in the first rotating hole.

12. The portable electronic device of claim 11, wherein the chip card ejecting mechanism further comprises a connecting member, the connecting member comprises a resisting pad and a second rotating shaft protruding from a first surface of the resisting pad, the rotating member defines a second rotating hole, the second rotating shaft is slidably received in the second rotating hole.

13. The portable electronic device of claim 12, wherein the connecting member further comprises a securing shaft protruding from a second surface of the resisting pad opposite to the second rotating member, the elastic member is sleeved around the securing shaft.

14. The portable electronic device of claim 8, wherein each guiding rail defines a second sliding slot along an axial direction of the hole parallel to the first sliding slots, each active gear is slidably received in one of the second sliding slots.

\* \* \* \* \*